United States Patent
Ketterson

(10) Patent No.: US 11,908,808 B2
(45) Date of Patent: Feb. 20, 2024

(54) MONOLITHIC MICROWAVE INTEGRATED CIRCUIT (MMIC) WITH EMBEDDED TRANSMISSION LINE (ETL) GROUND SHIELDING

(71) Applicant: Qorvo US, Inc., Greensboro, NC (US)

(72) Inventor: Andrew Arthur Ketterson, Dallas, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 18/097,901

(22) Filed: Jan. 17, 2023

(65) Prior Publication Data
US 2023/0253340 A1 Aug. 10, 2023

Related U.S. Application Data

(63) Continuation of application No. 16/689,253, filed on Nov. 20, 2019, now Pat. No. 11,557,545.
(Continued)

(51) Int. Cl.
*H01L 23/49* (2006.01)
*H01L 23/552* (2006.01)
(Continued)

(52) U.S. Cl.
CPC .......... *H01L 23/552* (2013.01); *H01L 23/367* (2013.01); *H01L 23/481* (2013.01);
(Continued)

(58) Field of Classification Search
CPC ..... H01L 23/552; H01L 23/66; H01L 23/481; H01L 23/367; H01L 23/49816;
(Continued)

(56) References Cited

U.S. PATENT DOCUMENTS

| 7,387,958 B2 | 6/2008 | McCarroll et al. |
| 7,534,722 B2 * | 5/2009 | Trezza ............... H01L 24/24 257/621 |

(Continued)

OTHER PUBLICATIONS

Banba, Seiichi, et al., "Small-Sized MMIC Amplifiers Using Thin Dielectric Layers," IEEE Transactions on Microwave Theory and Techniques, vol. 43, No. 3, Mar. 1995, pp. 485-492.
(Continued)

*Primary Examiner* — Sheikh Maruf
(74) *Attorney, Agent, or Firm* — Withrow & Terranova, P.L.L.C.

(57) ABSTRACT

A monolithic microwave integrated circuit (MMIC) with embedded transmission line (ETL) ground shielding is provided. In an exemplary aspect, an ETL MMIC according to this disclosure includes a MMIC substrate having an active side, an ETL dielectric layer covering the active side, and a topside ground plane over the ETL dielectric layer. The active side includes one or more transmission lines or other components which may undesirably couple to metal signal lines (e.g., package metal interconnects) in an external circuit assembly. The topside ground plane in the ETL MMIC provides shielding to reduce such electromagnetic coupling. The topside ground plane can also facilitate improved thermal paths for heat dissipation, such as through a redistribution layer (RDL) to a next higher assembly (NHA) and/or through a backside ground plane of the MMIC substrate.

20 Claims, 7 Drawing Sheets

Related U.S. Application Data

(60) Provisional application No. 62/775,198, filed on Dec. 4, 2018.

(51) Int. Cl.
  *H01L 23/66* (2006.01)
  *H01L 23/48* (2006.01)
  *H01L 23/367* (2006.01)
  *H01L 23/498* (2006.01)

(52) U.S. Cl.
  CPC ........ *H01L 23/49816* (2013.01); *H01L 23/66* (2013.01); *H01L 2223/6683* (2013.01)

(58) Field of Classification Search
  CPC ..... H01L 2223/6683; H01L 2223/6627; H01L 2223/6616; H01L 23/3128; H01L 2924/15174; H01L 2224/18; H01L 23/5383; H01L 23/5384
  USPC .......................................................... 257/786
  See application file for complete search history.

(56) References Cited

U.S. PATENT DOCUMENTS

| | | | |
|---|---|---|---|
| 7,825,440 B1 | 11/2010 | Choudhury | |
| 11,557,545 B2 | 1/2023 | Ketterson | |
| 2008/0061333 A1 | 3/2008 | Hidaka | |
| 2008/0074338 A1 | 3/2008 | Vacanti | |
| 2009/0251362 A1 | 10/2009 | Margomenos et al. | |
| 2010/0078771 A1* | 4/2010 | Barth | H01L 23/552 257/659 |
| 2012/0104561 A1* | 5/2012 | Kuo | H01L 23/481 257/621 |
| 2012/0280366 A1* | 11/2012 | Kamgaing | H01L 23/481 257/E23.114 |
| 2012/0313818 A1 | 12/2012 | Puzella et al. | |
| 2013/0207274 A1 | 8/2013 | Liu et al. | |
| 2014/0145883 A1 | 5/2014 | Baks et al. | |
| 2014/0264759 A1 | 9/2014 | Koontz et al. | |
| 2014/0340952 A1 | 11/2014 | Ramaswamy et al. | |
| 2015/0041873 A1 | 2/2015 | Karda et al. | |
| 2015/0353348 A1 | 12/2015 | Vandemeer et al. | |
| 2015/0380343 A1 | 12/2015 | Koontz et al. | |
| 2016/0118404 A1 | 4/2016 | Peng | |
| 2016/0172755 A1* | 6/2016 | Chen | H01Q 21/061 342/371 |
| 2016/0276729 A1* | 9/2016 | Dang | H01P 5/107 |
| 2016/0293557 A1 | 10/2016 | Topak et al. | |
| 2016/0322368 A1* | 11/2016 | Sun | H10B 51/20 |
| 2016/0336282 A1 | 11/2016 | Dang et al. | |
| 2016/0336637 A1 | 11/2016 | Dang et al. | |
| 2017/0154859 A1* | 6/2017 | Yap | H01Q 1/2283 |
| 2017/0345761 A1* | 11/2017 | Yu | H01L 21/565 |
| 2018/0175476 A1* | 6/2018 | Teshiba | H01L 23/367 |
| 2018/0191051 A1 | 7/2018 | Ndip et al. | |
| 2019/0295968 A1* | 9/2019 | Bayrakci | H01L 23/49827 |
| 2020/0235244 A1* | 7/2020 | Doyle | H01L 29/66666 |
| 2022/0102835 A1* | 3/2022 | Makurin | H01Q 1/52 |

OTHER PUBLICATIONS

Hirano, Makoto, et al., "Three-Dimensional Passive Circuit Technology for Ultra-Compact MMIC's," IEEE Transactions on Microwave Theory and Techniques, vol. 43, No. 12, Dec. 1995, pp. 2845-2850.

Tserng, Hua-Quen et al., "Embedded transmission-Line (ETL) MMIC for low-cost high-density wireless communication applications," IEEE Transactions on Microwave Theory and Techniques, vol. 45, No. 12, Dec. 1997, pp. 2540-2548.

Tserng, Hua-Quen et al., "K/Ka-band low-noise embedded transmission line (ETL) MMIC amplifiers," IEEE Transactions on Microwave Theory and Techniques, vol. 46, No. 12, Dec. 1998, pp. 2604-2610.

Watson, Thomas, et al., "Design of a K-band transmit phased array for low Earth orbit satellite communications," IEEE International Conference on Phased Array Systems and Technology (Cat. No. 00TH8510), May 21-25, 2000, Dana Point, CA, pp. 211-214.

Non-Final Office Action for U.S. Appl. No. 16/689,253, dated Apr. 15, 2021, 10 pages.

Non-Final Office Action for U.S. Appl. No. 16/689,253, dated Nov. 29, 2021, 11 pages.

Final Office Action for U.S. Appl. No. 16/689,253, dated Jun. 8, 2022, 11 pages.

9 Notice of Allowance for U.S. Appl. No. 16/689,253, dated Sep. 19, 2022, 9 pages.

* cited by examiner

MONOLITHIC MICROWAVE INTEGRATED CIRCUIT (MMIC) WITH EMBEDDED TRANSMISSION LINE (ETL) GROUND SHIELDING

RELATED APPLICATIONS

This application is a continuation of application Ser. No. 16/689,253, filed Nov. 20, 2019, now U.S. Pat. No. 11,557,545, which claims the benefit of provisional patent application Ser. No. 62/775,198, filed Dec. 4, 2018, the disclosures of which are hereby incorporated herein by reference in their entireties.

FIELD OF THE DISCLOSURE

This application relates to packaging of radio frequency (RF) integrated circuits (ICs).

BACKGROUND

Mobile devices, such as cellular phones, demand increasingly smaller integrated circuits (ICs), including radio frequency (RF) circuits. The performance of high-frequency RF circuits in general and monolithic microwave integrated circuits (MMICs) in particular is sensitive to the coupling of electromagnetic (EM) energy into nearby structures. As IC package and module sizes decrease, nearby metal features in the package or next higher assembly (NHA) can couple to these RF circuits and perturb their performance. Such coupling is becoming more of a problem, especially for RF frequencies above 2 gigahertz (GHz).

SUMMARY

A monolithic microwave integrated circuit (MMIC) with embedded transmission line (ETL) ground shielding is provided. Fanout-style packaging, such as fanout wafer-level packaging (FOWLP) or fanout panel-level packaging (FOPLP), facilitates a high density package for MMICs. However, fanout-style packaging may produce undesired electromagnetic (EM) coupling between an active side of a MMIC and metal features in an external circuit assembly, such as a redistribution layer (RDL) of the FOW/PLP package and/or a next higher assembly (NHA). In an exemplary aspect, an ETL MMIC according to this disclosure includes a MMIC substrate having an active side, an ETL dielectric layer covering the active side, and a topside ground plane over the ETL dielectric layer. The active side includes one or more transmission lines or other components which may undesirably couple to metal signal lines (e.g., package metal interconnects) in the external circuit assembly. The topside ground plane in the ETL MMIC provides shielding to reduce such EM coupling. The topside ground plane can also facilitate improved thermal paths for heat dissipation, such as through the RDL to the NHA and/or through a backside ground plane of the MMIC substrate.

An exemplary embodiment provides a MMIC package. The MMIC package includes an ETL MMIC, which includes a MMIC substrate having an active side comprising a transmission line. The ETL MMIC further includes an ETL dielectric layer disposed at least partially over the active side of the MMIC substrate and surrounding the transmission line. The ETL MMIC further includes a topside ground plane disposed over the ETL dielectric layer and configured to reduce EM coupling between the transmission line of the active side and an external circuit assembly.

Another exemplary embodiment further provides a method for packaging a MMIC. The method includes providing a MMIC substrate having an active side comprising a transmission line. The method further includes forming an ETL MMIC by: embedding the transmission line in an ETL dielectric layer deposited over the MMIC substrate; and depositing a topside ground plane over the ETL dielectric layer. The topside ground plane is configured to reduce EM coupling between the transmission line of the active side and an external circuit assembly.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
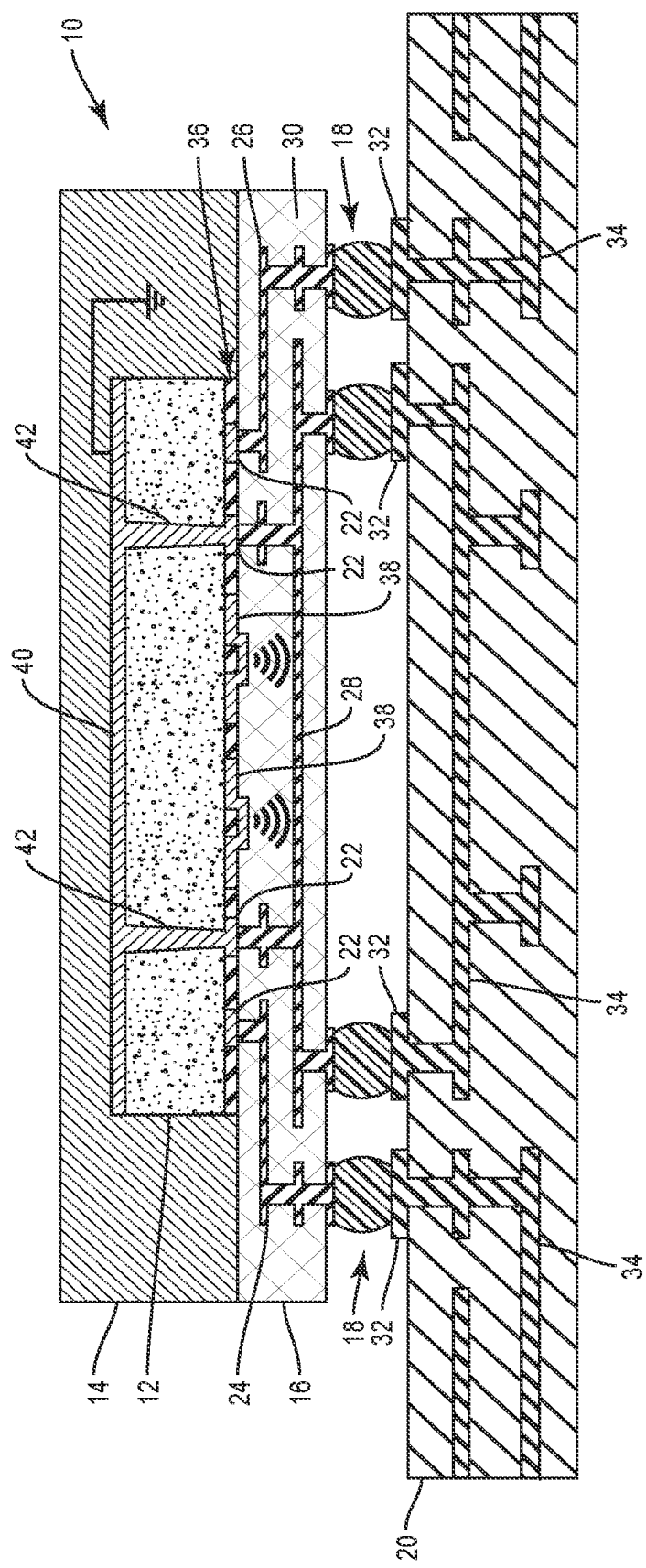
FIG. 1 is a cross-sectional view of an exemplary embodiment of a monolithic microwave integrated circuit (MMIC) circuit package.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

A monolithic microwave integrated circuit (MMIC) with embedded transmission line (ETL) ground shielding is provided. Fanout-style packaging, such as fanout wafer-level packaging (FOWLP) or fanout panel-level packaging (FOPLP), facilitates a high density package for MMICs. However, fanout-style packaging may produce undesired electromagnetic (EM) coupling between an active side of a MMIC and metal features in an external circuit assembly, such as a redistribution layer (RDL) of the FOW/PLP package and/or a next higher assembly (NHA). In an exemplary aspect, an ETL MMIC according to this disclosure includes a MMIC substrate having an active side, an ETL dielectric layer covering the active side, and a topside ground plane over the ETL dielectric layer. The active side includes one or more transmission lines or other components which may undesirably couple to metal signal lines (e.g., package metal interconnects) in the external circuit assembly. The topside ground plane in the ETL MMIC provides shielding to reduce such EM coupling. The topside ground plane can also facilitate improved thermal paths for heat dissipation, such as through the RDL to the NHA and/or through a backside ground plane of the MMIC substrate.

FIG. 1 is a cross-sectional view of an exemplary embodiment of a MMIC circuit package 10. The MMIC circuit package 10 includes a MMIC substrate 12 surrounded by an overmold layer 14 and attached to an RDL 16. An interconnection layer 18 attaches the RDL 16 to an NHA 20, which may be a printed circuit board (PCB) or another component which supports the MMIC circuit package 10 and/or electrically connects the MMIC circuit package 10 to other components in a radio frequency (RF) device (e.g., a mobile device).

In this regard, the MMIC circuit package 10 can form an RF module in which the MMIC substrate 12 is packaged using FOWLP, also referred to as wafer-level fanout (WLFO) packaging. Other examples are packaged with FOPLP or a similar packaging approach. FOWLP and FOPLP are packaging technologies that allow the use of semiconductor-like thin-film processes (e.g., high-resolution lithographic patterning, physical vapor deposition (PVD) metallizations and chemical vapor deposition (CVD) dielectrics) to spread out (e.g., fan out) dense input/output (I/O) connections on the MMIC substrate 12 to accommodate the larger dimensions on the NHA 20, such as a PCB, interposer, or chip-scale package (CSP). In some examples, the MMIC circuit package 10 can include multiple MMIC substrates 12 and/or other circuit components to form a multi-chip module (MCM) or multi-chip package (MCP). In such examples, a common RDL 16 may make connections between the MMIC substrates 12 and/or other circuit components.

For example, in one embodiment of the FOWLP process, known-good die (KGD) (e.g., the MMIC substrate 12 and a plurality of additional MMIC substrates) and sometimes other passive components are precisely placed onto a temporary carrier (not shown), often called a reconstructed wafer, and epoxy over-molded to form the overmold layer 14. The KGD can be formed from one or more MMIC wafers which are diced to form the MMIC substrate 12 and a plurality of additional MMIC substrates, then overmolded into an overmolded MMIC array. A portion of the overmold layer 14 can be removed to expose a top and/or back surface of the MMIC substrate 12 such that the overmold layer 14 partially surrounds the MMIC substrate 12 (e.g., surrounding only lateral sides of the MMIC substrate 12 or the lateral sides and one of the topside or backside of the MMIC substrate 12).

One or more RDLs 16 and dielectric layers are formed over the exposed surface of the MMIC substrate 12, and via holes are defined using semiconductor-like processes and tools to route metal traces away from tightly pitched input/output (I/O) pads 22 on the MMIC substrate 12 to the periphery of the MMIC circuit package 10 (or to other components within the same package in the case of a multi-chip module). Thus, the RDL 16 includes a plurality of signal lines 24, 26, 28 connected to the I/O pads 22 (e.g., conductors of the MMIC substrate 12) and an insulating material 30 which isolates at least some of the signal lines 24, 26, 28 from one another. For example, a first signal line 24 may be isolated from a second signal line 26 and a third signal line 28.

Depending on whether a chips-first or chips-last approach is used, the RDL 16 interconnects (e.g., signal lines 24, 26, 28) are either formed directly on top of the overmolded MMIC substrate 12 or are formed on the carrier before the MMIC substrate 12 (and other components) is attached and overmolded. In some examples, the RDL 16 is formed as a multilayer laminate. With the I/O pads 22 now redistributed (i.e. fanned out), the MMIC circuit package 10 is capable of being attached to NHA pads 32 arrayed at a wider pitch on the NHA 20 (here illustrated as a multilayer PCB, though other configurations can be used). The interconnection layer 18 (e.g., a ball grid array, a land-grid array, or another appropriate interconnection) is used to attach the MMIC circuit package 10 to the NHA 20 and connect the signal lines 24, 26, 28 in the RDL 16 to the NHA pads 32 and NHA conductors 34 (e.g., routing to other components attached to the NHA 20). After the RDL 16 or the interconnection layer 18 is formed, the overmolded MMIC array can be diced into the MMIC circuit package 10.

The MMIC substrate 12 includes an active side 36, which may be referred to as a topside of the MMIC substrate 12. In an exemplary aspect, the MMIC substrate 12 is oriented active side 36 down, i.e., with the active side 36 facing the RDL 16. One or more components which are sensitive to EM coupling may be part of or coupled to the active side 36. For example, one or more RF transmission lines 38 and/or other passive components (e.g., tuning networks, interconnecting conductors, and so forth) may be on the active side 36 of the MMIC substrate 12. In some examples, one or more of the RF transmission line 38 or other passive components may be particularly sensitive to EM coupling with structures near the MMIC substrate 12. In some examples, the active side 36 can further include EM-sensitive active elements, such as transistors and diodes.

The MMIC substrate 12 can also include a backside ground plane 40 on an opposite side of the MMIC substrate 12 from the active side 36 (e.g., the backside of the MMIC substrate 12). The backside ground plane 40 may be electrically connected to the RDL 16 by one or more ground vias 42 (e.g., through-substrate vias (TSVs)) through the MMIC substrate 12.

For high-frequency RF circuits, such as the MMIC substrate 12, the proximity of an external circuit assembly, such as the signal lines 24, 26, 28 in the RDL 16 or the NHA conductors 34 in the NHA 20, can cause undesirable coupling with the RF transmission line 38 or other EM-sensitive components that interferes with the proper operation and performance of the circuit in the active side 36. Careful simulation and modeling of the influence of these nearby metal features is required to design high-frequency circuits for such an environment, especially for components that extend into millimeter-wave (mmW) frequency bands. Such simulations can be very time consuming (driving up manufacturing costs), and may still fall short of accounting for all interference factors and the resultant RF circuit or system performance can suffer.

Through careful design it is possible to use a layer of the RDL 16 in close proximity to the MMIC substrate 12 as a ground plane, which may effectively shield the circuit from the influence of other nearby metal traces. The effect of such a ground plane in the RDL 16 needs to be considered in the design of the MMIC substrate 12 since it will have a significant effect on the characteristics of the transmission lines. This means that the circuit of the unpackaged MMIC substrate 12 without the ground plane will behave much differently than the MMIC circuit package 10, which can complicate wafer-level KGD testing and module troubleshooting.

Figure 2:
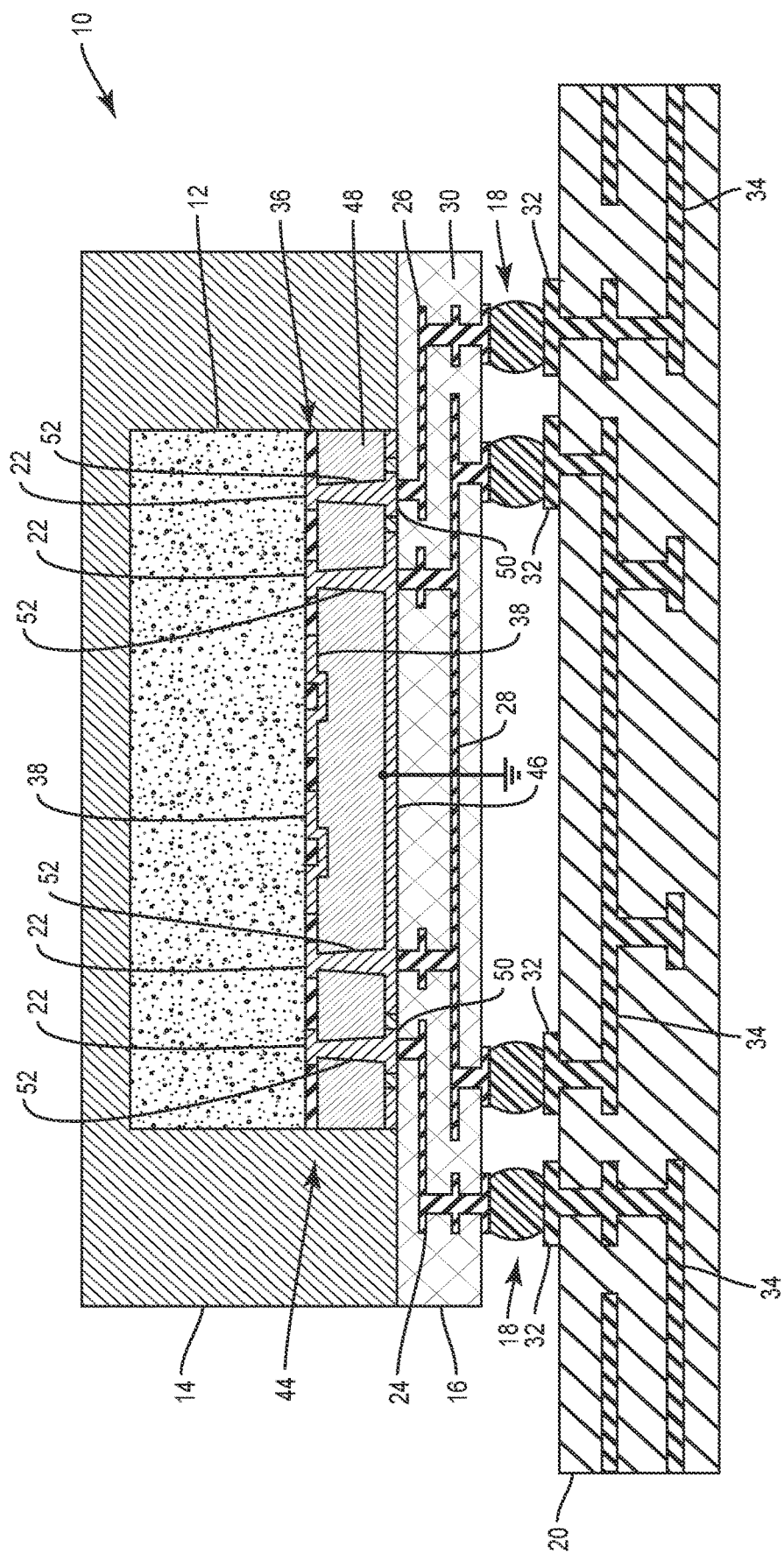
FIG. 2 is a cross-sectional view of another exemplary embodiment of the MMIC circuit package of FIG. 1 having an embedded transmission line (ETL) MMIC with a topside ground plane to provide electromagnetic (EM) shielding for a MMIC substrate.

FIG. 2 is a cross-sectional view of another exemplary embodiment of the MMIC circuit package 10 of FIG. 1 having an ETL MMIC 44 with a topside ground plane 46 to provide EM shielding for the MMIC substrate 12. The topside ground plane 46 reduces or eliminates EM coupling between an external circuit assembly (e.g., the signal lines 24, 26, 28 in the RDL 16 or the NHA conductors 34 in the NHA 20) with the RF transmission line 38 or other EM-sensitive components (e.g., passive components, such as RF transmission lines used for impedance matching, tuning networks, interconnecting conductors, and so on) of the MMIC substrate 12.

In this regard, the ETL MMIC 44 includes the MMIC substrate 12, an ETL dielectric layer 48 disposed at least partially over the active side 36 of the MMIC substrate 12 and surrounding the RF transmission lines 38 (e.g., covering the active side 36), and the topside ground plane 46. The topside ground plane 46 and ETL I/O pads 50 are disposed over the ETL dielectric layer 48 (e.g., with the topside ground plane 46 covering a majority of a surface of the ETL dielectric layer 48 opposite the active side 36). The topside ground plane 46 and the ETL I/O pads 50 interface with (e.g., electrically connect to) the signal lines 24, 26, 28 in the RDL 16. One or more ETL vias 52 are provided through the ETL dielectric layer 48 to connect the ETL I/O pads 50 with the I/O pads 22 on the MMIC substrate 12. In this configuration, the topside ground plane 46 in the ETL MMIC 44 provides a ground reference to the RF transmission line 38 on the active side 36, but more importantly acts to shield the circuit in the ETL MMIC 44 from external circuit assemblies, including the RDL 16 and NHA 20.

In an exemplary aspect, the ETL MMIC 44 is formed during the wafer-level processing of the MMIC substrate 12 (e.g., prior to the FOWLP process described above). The MMIC substrate 12 can be formed using a conventional MMIC processing technique up to the point of providing interconnections between wafer components, such as the RF transmission line 38. One or more RF transmission lines 38 are formed as a dielectric bridge (e.g., a polyimide bridge), an air bridge, or similar. One or more via plugs (e.g., for the ETL vias 52) are deposited for interconnection to the active side 36 (e.g., transistor sources or emitters, ground components, RF inputs or outputs, etc.). The via plugs can be formed from a metal, such as gold, copper, silver, aluminum, or combinations of metals including plated or alloyed metals.

The ETL dielectric layer 48 is deposited over the active side 36 of the MMIC substrate 12 (e.g., surrounding the RF transmission lines 38 and the via plugs for the ETL vias 52). The ETL dielectric layer 48 can include one or more of polyimide, polynorbornenes, benzocyclobutene (BCB), polytetrafluoroethylene (PTFE), hydrogen silsesquioxane (HSQ), methylsilsesquioxane (MSQ), or other dielectric materials having good RF properties. Other examples include inorganic dielectrics, such as silicon dioxide ($SiO_2$), silicon nitride (SiN), silicon carbide (SiC), carbon doped oxides (e.g., SiCOH), aluminum oxide ($Al_2O_3$), zinc oxide (ZnO), gallium oxide (GaO), boron nitride (BN), etc. In some examples, the ETL dielectric layer 48 is spun on, and in other examples the ETL dielectric layer 48 (and the topside ground plane 46) is laminated over the active side 36. After curing, the ETL dielectric layer 48 and/or the via plugs can be machined to provide a planar topside surface.

The topside ground plane 46 and the ETL I/O pads 50 (completing the ETL vias 52) are deposited over the topside surface of the ETL dielectric layer 48. In some examples, the topside ground plane 46 and the ETL I/O pads 50 can be deposited through an appropriate technique, such as vapor deposition, sputtering, evaporation, spin-on, plating, printing, chemical deposition, lamination, and combinations of these techniques.

The RDL 16 is designed according to good RF design practices for properly shielded controlled-impedance RF transmission lines using appropriate topologies (e.g., microstrip, stripline, etc.) for mmW circuits. Where traditional FOWLP packaging requires additional ground layers in the RDL 16, the topside ground plane 46 in the ETL MMIC 44 can further provide a ground reference to the signal lines 24, 26, 28 in the RDL 16 to reduce or eliminate such ground layers in the RDL 16. Additional grounding vias and solder balls may also be required for control of RF signals in the vertical transitions between the MMIC substrate 12 and the RDL 16, within layers of the RDL 16, and into the NHA 20.

An advantage of the embodiment of the MMIC circuit package 10 of FIG. 2 is that design optimization of the package routing of the RDL 16 and NHA 20 can largely take place without affecting the performance of the ETL MMIC 44 itself since it is effectively shielded by its own topside ground plane 46 (and optionally backside ground plane 40, as described below with respect to FIG. 3) that effectively decouples the circuit design from the package design problem. The ETL MMIC 44 with the topside ground plane 46 can be fully RF tested in die or wafer form before assembly (assuring KGD) of the MMIC circuit package 10 knowing that there will be little change in the packaged form. This is not possible if the RDL 16 were used as a ground plane as discussed in FIG. 1, and the effects of the layers of the RDL 16 would therefore need to be considered during the circuit design phase. The design of the ETL MMIC 44 can, however, require adjusted models for the passive and active components of the active side 36 of the MMIC substrate 12.

In some examples, the ETL MMIC 44 can include multiple ETL dielectric layers 48 and metal layers between the MMIC substrate 12 and the topside ground plane 46 to realize microstrip and stripline transmission lines in various layers and configurations. In these examples, the topside ground plane 46 continues to shield all such elements of the ETL MMIC 44 from EM coupling with the RDL 16, NHA 20, or other external circuit assembly.

The MMIC circuit package 10 is depicted herein as a FOWLP package for illustrative purposes. It should be understood that the self-shielded nature of the ETL MMIC 44 with the topside ground plane 46 is also advantageous in other packaging configurations. In flip-chip in-package or on-board configurations when bumps or pillars are formed on the ETL I/O pads 50, the topside ground plane 46 can make the ETL MMIC 44 insensitive (or less sensitive) to underfill, overmold, and underlying metal layers. For example, a fine pitch ball grid array (FBGA) can be attached to the ETL MMIC 44 (e.g., in place of the RDL 16), with one or more signal lines connecting the ETL I/O pads 50 to the NHA pads 32.

Figure 3:
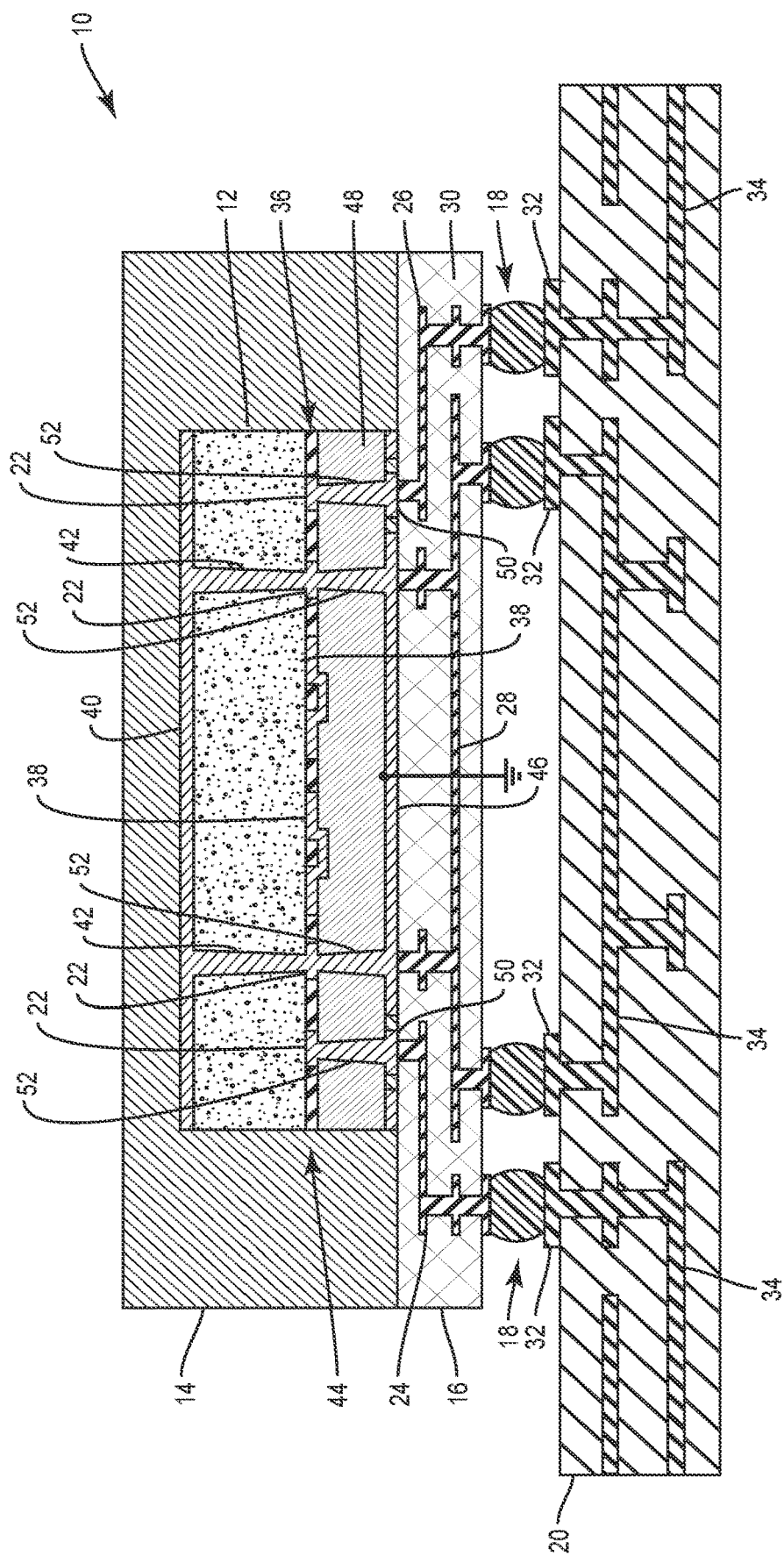
FIG. 3 is a cross-sectional view of another exemplary embodiment of the MMIC circuit package of FIG. 2 with a backside ground plane.

FIG. 3 is a cross-sectional view of another exemplary embodiment of the MMIC circuit package 10 of FIG. 2 with a backside ground plane 40. The backside ground plane 40 is similar to the backside ground plane 40 described above with respect to FIG. 1. In this embodiment, the backside of the MMIC substrate 12 is thinned, and the backside ground plane 40 is connected to the active side 36 and the topside ground plane 46 using the ground vias 42 through the MMIC substrate 12. This adds another level of shielding and reduces or eliminates deleterious EM modes within the ETL MMIC 44.

With reference to FIGS. 2 and 3, the ETL MMIC 44 with the topside ground plane 46 can provide improved heat dissipation through the topside of the MMIC circuit package 10. That is, an improved path for heat transfer is provided from the active side 36 of the MMIC substrate 12 (e.g., where active components may generate heat), through the ETL vias 52, the topside ground plane 46, and the RDL 16 into the NHA 20. Another path for heat transfer can be provided through the backside of the package (e.g., the backside of the MMIC substrate 12 into a heat exchanger (e.g., a heatsink or cold plate), as illustrated in FIGS. 4A-4C below.

Figure 4A:
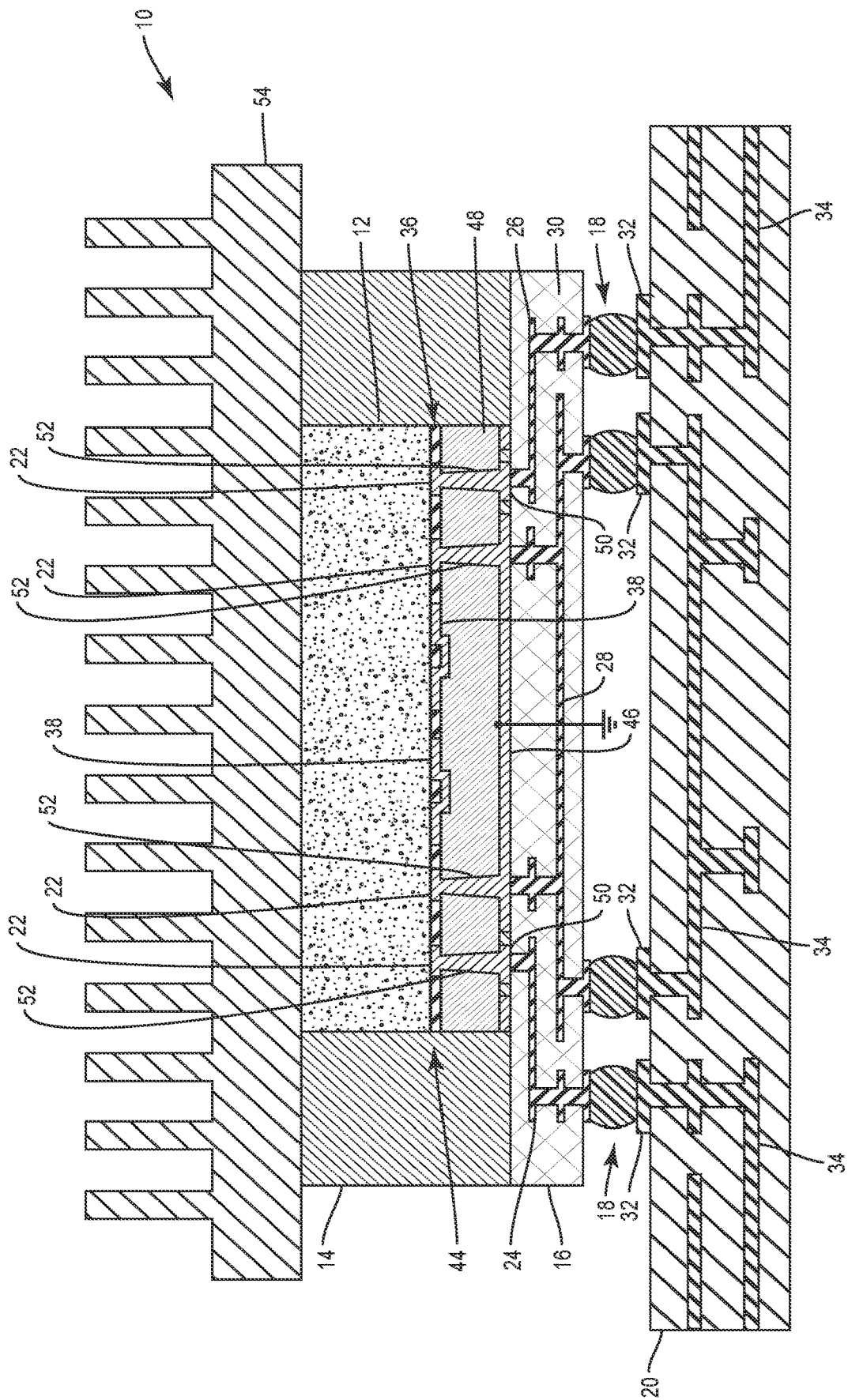
FIG. 4A is a cross-sectional view of another exemplary embodiment of the MMIC circuit package of FIG. 2 with a heat exchanger coupled to a backside of the MMIC substrate.

FIG. 4A is a cross-sectional view of another exemplary embodiment of the MMIC circuit package 10 of FIG. 2 with a heat exchanger 54 coupled to the backside of the MMIC substrate 12. In an exemplary aspect, the thermal conductivity through the MMIC substrate 12 is improved by exposing the backside of the MMIC substrate 12 (or exposing a thermal spreader attached to the backside of the MMIC substrate 12) from within the overmold layer 14 through a subtractive grind/etch process or a selective molding process. The heat exchanger 54 may be attached to the MMIC substrate 12 through an appropriate technique, such as through an adhesive (e.g., a thermal conducting adhesive). The heat exchanger 54 can be a heat sink or cold plate, and can exchange heat through liquid, air, conduction, convection, etc., as appropriate.

Figure 4B:
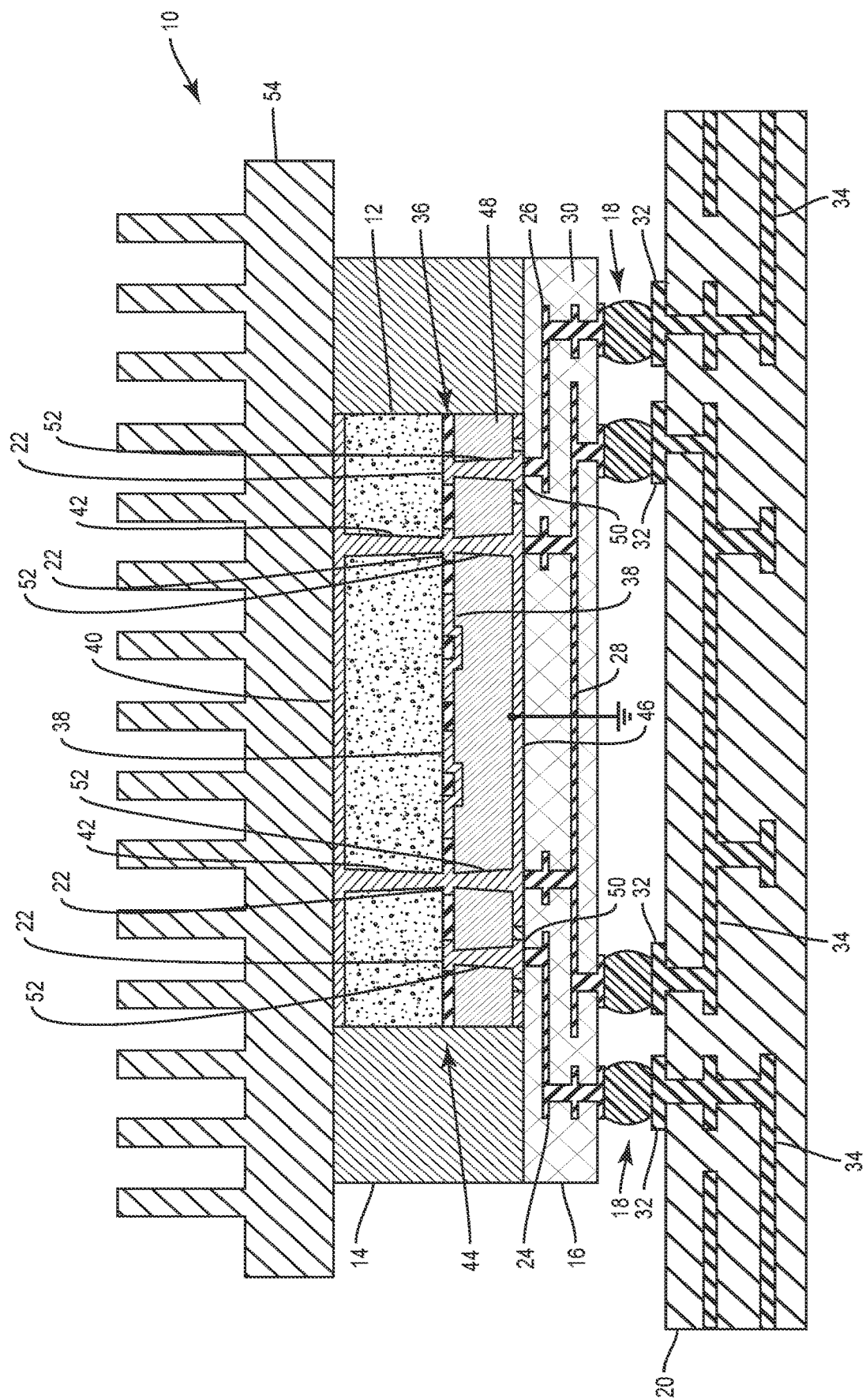
FIG. 4B is a cross-sectional view of another exemplary embodiment of the MMIC circuit package of FIG. 3 with the heat exchanger coupled to the backside ground plane of the MMIC substrate.

FIG. 4B is a cross-sectional view of another exemplary embodiment of the MMIC circuit package 10 of FIG. 3 with the heat exchanger 54 coupled to the backside ground plane 40 of the MMIC substrate 12. In an exemplary aspect, the backside ground plane 40 covers a majority of the backside of the MMIC substrate 12, providing an increased conductivity and surface area for contacting the heat exchanger 54. The thermal conductivity into the heat exchanger 54 is further improved through by connecting the backside ground plane 40 to the active side 36 (and heat-generating components on the active side 36) using the ground vias 42 through the MMIC substrate 12. This further thermally connects the heat exchanger 54 to the topside ground plane 46, the RDL 16, and/or the NHA 20 to provide additional heat dissipation (which can be bidirectional through both the NHA 20 and the heat exchanger 54). The heat exchanger 54 may be attached to the backside ground plane 40 through an appropriate technique, such as soldering or brazing to the backside ground plane 40 or through an adhesive.

Figure 4C:
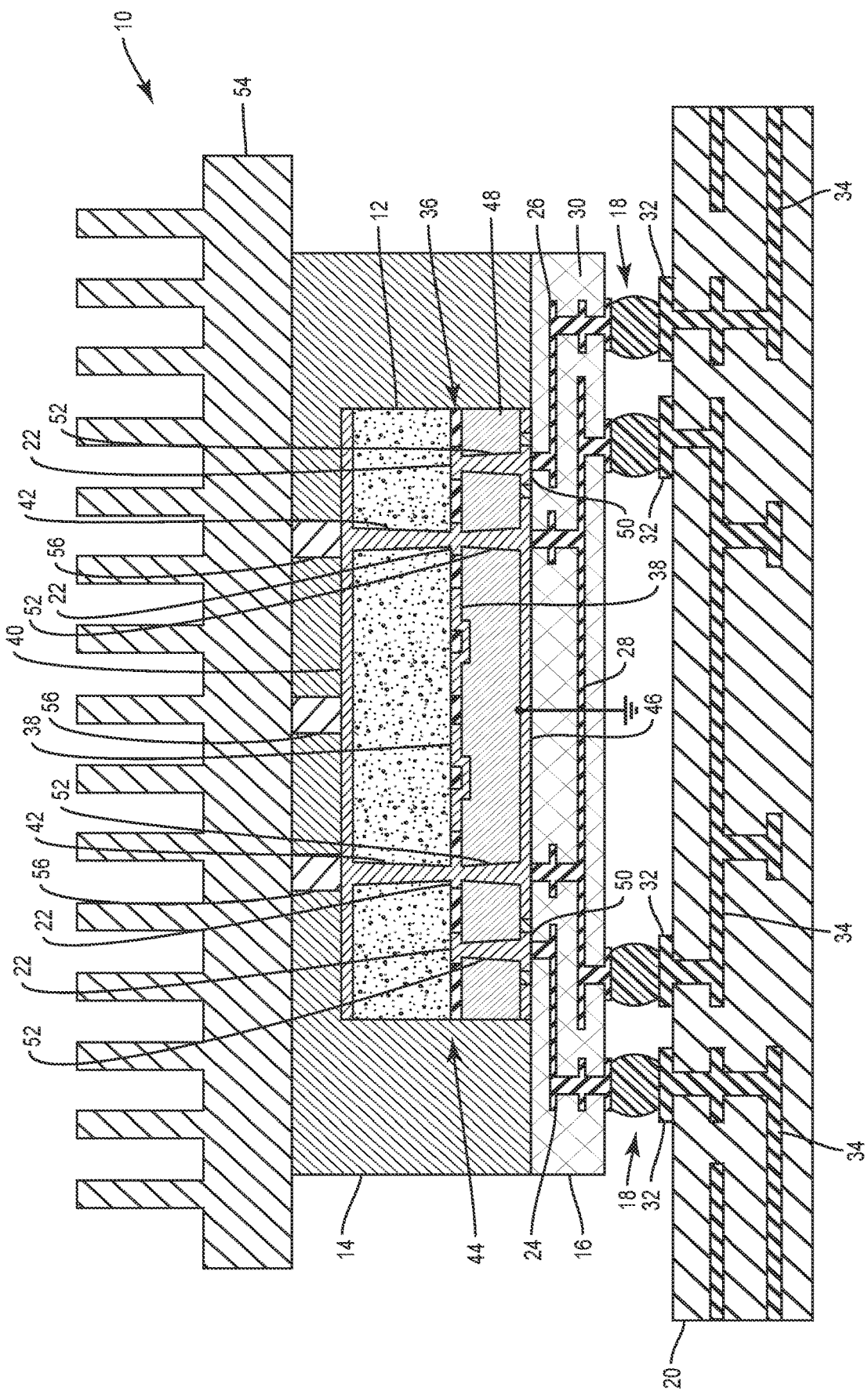
FIG. 4C is a cross-sectional view of another exemplary embodiment of the MMIC circuit package of FIG. 3 with a heat exchanger coupled to the MMIC substrate via conductive pillars through the overmold layer.

FIG. 4C is a cross-sectional view of another exemplary embodiment of the MMIC circuit package 10 of FIG. 3 with a heat exchanger 54 coupled to the MMIC substrate 12 via conductive regions 56 (e.g., realized with copper pillars or other conductive elements) through the overmold layer 14. In an exemplary aspect, a high thermal conductivity path is created through the backside of the MMIC circuit package 10 without needing to remove the overmold layer 14 entirely by forming thermal spreaders directly over the ground vias 42 and any hot spots on the backside of the MMIC substrate 12 (e.g., the backside ground plane 40). In some examples, the conductive regions 56, the ground vias 42, and/or other thermally conducting structures are formed near heat sources on the MMIC substrate 12 (e.g., transistors or other active elements on the active side 36).

The conductive regions 56 can be formed as vias or using other appropriate techniques. Alternatively, semiconductor processes currently practiced could be used to form the conductive regions 56 similar to the formation of copper bumps for flip-chip-attached semiconductor die (which may be larger than depicted). The conductive regions 56 can be used to conduct heat out of the backside of the MMIC substrate 12 if the conductive regions 56 are suitably exposed from the overmold layer 14. In this regard, the conductive regions 56 can be formed before or after depositing the overmold layer 14. If formed before, the overmold layer 14 can be partially removed to expose the conductive regions 56 while leaving a majority of the overmold layer 14 covering the backside of the MMIC substrate 12. The heat exchanger 54 may be attached to the conductive regions 56 and/or the overmold layer 14 through an appropriate technique, such as soldering or brazing to the conductive regions 56 or through an adhesive.

Figure 5:
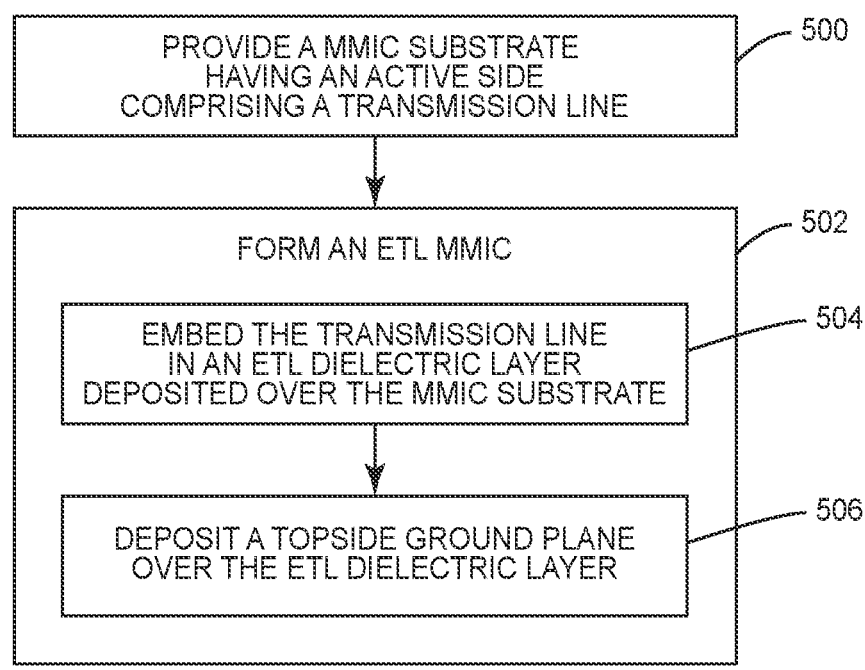
FIG. 5 is a flow diagram illustrating a process for packaging a MMIC.

FIG. 5 is a flow diagram illustrating a process for packaging a MMIC. The process begins at operation 500, with providing a MMIC substrate having an active side comprising a transmission line. The process continues at operation 502, with forming an ETL MMIC. In an exemplary aspect, the ETL MMIC is formed during wafer-level processing of the MMIC substrate, and can be formed concurrently or sequentially with the transmission line. The process continues at sub-operation 504, with embedding the transmission line in an ETL dielectric layer deposited over the MMIC substrate. The process continues at operation 506, with depositing a topside ground plane over the ETL dielectric layer. In an exemplary aspect, one or more ETL vias are also formed to connect the topside ground plane to components on the active side of the MMIC substrate. In another aspect, the topside ground plane is configured to reduce EM coupling between the transmission line of the active side and an external circuit assembly.

Although the operations of FIG. 5 are illustrated in a series, this is for illustrative purposes and the operations are not necessarily order dependent. Some operations may be performed in a different order than that presented. Further, processes within the scope of this disclosure may include fewer or more steps than those illustrated in FIG. 5. For example, the steps of operation 502 can include multiple depositions of dielectric layers and metallization layers to form additional transmission lines (e.g., microstrip and stripline transmission lines) to achieve desired circuit performance.

Those skilled in the art will recognize improvements and modifications to the preferred embodiments of the present disclosure. All such improvements and modifications are considered within the scope of the concepts disclosed herein and the claims that follow.

What is claimed is:

1. A method for packaging a monolithic microwave integrated circuit (MMIC), the method comprising:
    forming a MMIC substrate having an active side comprising a transmission line; and
    forming an embedded transmission line (ETL) MMIC by:
        embedding the transmission line in an ETL dielectric layer deposited over the MMIC substrate; and
        depositing a topside ground plane over the ETL dielectric layer;
    wherein the topside ground plane is configured to reduce electromagnetic coupling between the transmission line of the active side and an external circuit assembly.

2. The method of claim 1, further comprising spinning the ETL dielectric layer over the active side of the MMIC substrate.

3. The method of claim 1, further comprising depositing the ETL dielectric layer over the active side of the MMIC substrate by vapor deposition or chemical vapor deposition.

4. The method of claim 1, further comprising spray coating the ETL dielectric layer over the active side of the MMIC substrate.

5. The method of claim 1, further comprising laminating the ETL dielectric layer and the topside ground plane over the active side of the MMIC substrate.

6. The method of claim 1, further comprising attaching the external circuit assembly to the ETL MMIC.

7. The method of claim 6, further comprising connecting a signal line of a redistribution layer (RDL) in the external circuit assembly to the transmission line.

8. The method of claim 7, further comprising connecting the RDL to a Next Higher Assembly (NHA).

9. The method of claim 7, wherein forming the MMIC substrate further comprises forming a backside ground plane on the MMIC substrate.

10. The method of claim 9, further comprising coupling the RDL to the backside ground plane.

11. The method of claim 7, wherein the NHA comprises at least one of a printed circuit board, an interposer, and a chip-scale package.

12. The method of claim 6, further comprising connecting a signal line of a fine pitch ball grid array (FBGA) in the external circuit assembly to the transmission line of the MMIC substrate.

13. The method of claim 1, wherein forming the MMIC substrate further comprises surrounding the MMIC substrate with an overmold layer.

14. The method of claim 13, further comprising:
    exposing a surface of the MMIC substrate through the overmold layer;
    forming a redistribution layer (RDL) on the exposed surface of the MMIC substrate;
    connecting a signal line of the RDL to the transmission line of the MMIC substrate.

15. A method for packaging a monolithic microwave integrated circuit (MMIC), the method comprising:
    forming a MMIC substrate having an active side;
    depositing an embedded transmission line (ETL) dielectric layer over the MMIC substrate;
    embedding a transmission line in the ETL dielectric layer deposited over the MMIC substrate;
    forming a ground plane on the active side of the MMIC substrate such that the ground plane sets a ground reference for the transmission line.

16. The method of claim 15, further comprising connecting a signal line of a redistribution layer (RDL) to the transmission line.

17. The method of claim 16, further comprising connecting the RDL to a Next Higher Assembly (NHA).

18. The method of claim 16, further comprising forming a backside ground plane on a backside of the MMIC substrate, the backside of the MMIC substrate being oppositely disposed to the active side.

19. The method of claim 18, further comprising coupling the RDL to the backside ground plane.

20. The method of claim 15, further comprising connecting a signal line of a fine pitch ball grid array (FBGA) to the transmission line.

* * * * *